(12) United States Patent
Zhang et al.

(10) Patent No.: US 11,540,407 B2
(45) Date of Patent: Dec. 27, 2022

(54) FLEXIBLE DISPLAY DEVICE

(71) Applicant: Wuhan China Star Optoelectronics Semiconductor Display Technology Co., Ltd., Wuhan (CN)

(72) Inventors: Zhuo Zhang, Wuhan (CN); Fang Wang, Wuhan (CN); Wen Han, Wuhan (CN); Zikang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 386 days.

(21) Appl. No.: 16/954,213

(22) PCT Filed: Nov. 22, 2019

(86) PCT No.: PCT/CN2019/120151
§ 371 (c)(1),
(2) Date: Jun. 16, 2020

(87) PCT Pub. No.: WO2021/077524
PCT Pub. Date: Apr. 29, 2021

(65) Prior Publication Data
US 2022/0322553 A1 Oct. 6, 2022

(30) Foreign Application Priority Data

Oct. 23, 2019 (CN) .......................... 201911013732.3

(51) Int. Cl.
*H05K 5/02* (2006.01)
*H05K 5/00* (2006.01)

(52) U.S. Cl.
CPC ......... *H05K 5/0226* (2013.01); *H05K 5/0017* (2013.01)

(58) Field of Classification Search
CPC ...................................................... G06F 1/166
See application file for complete search history.

(56) References Cited

U.S. PATENT DOCUMENTS

| | | | |
|---|---|---|---|
| 10,082,826 B1* | 9/2018 | Salmon | G06F 1/1652 |
| 10,203,863 B2* | 2/2019 | Kwon | G09G 5/14 |

FOREIGN PATENT DOCUMENTS

| | | |
|---|---|---|
| CN | 101238426 | 8/2008 |
| CN | 206039368 | 3/2017 |
| CN | 106847103 | 6/2017 |
| CN | 206564106 | 10/2017 |
| CN | 110047384 | 7/2019 |
| JP | 2018-071715 | 5/2018 |

* cited by examiner

*Primary Examiner* — Jerry Wu
(74) *Attorney, Agent, or Firm* — PV IP PC; Wei Te Chung; Ude Lu (57) ABSTRACT

The present invention provides a flexible display device, which includes a case, a rewinding component, a flexible display component, a rotating component, and a cover plate, wherein a portion of the flexible display component is disposed at one side of the case, another portion of the flexible display component extends into the storage chamber and is connected to the rewinding component, and when the flexible display component is pulled out from the storage chamber, the rewinding component provides an elastic pulling force for rolling up the flexible display component; and the cover plate is rotatably connected to the flexible display component, and serves as a protective shell, a bracket, a support plate, or a support reinforcement plate to avoid depressing.

16 Claims, 8 Drawing Sheets

FLEXIBLE DISPLAY DEVICE

RELATED APPLICATIONS

This application is a National Phase of PCT Patent Application No. PCT/CN2019/120151 having International filing date of Nov. 22, 2019, which claims the benefit of priority of Chinese Patent Application No. 201911013732.3 filed on Oct. 23, 2019. The contents of the above applications are all incorporated by reference as if fully set forth herein in their entirety.

FIELD AND BACKGROUND OF THE INVENTION

The present application relates to the technical field of display panels, and in particular, to a flexible display device.

At present, flexible display devices have been more and more popular in the market due to their advantages of good resistance to bending, which can realize arbitrary switching between a large screen and a small screen by unfolding or folding and rolling up the flexible screen.

In the existing flexible display device, when the flexible screen is folded, a portion of the flexible screen exposed to the outside environment is easily impacted, dropped, and scratched, thus increasing the risk of damage to the flexible screen. When the flexible screen is unfolded, in order to obtain a sufficiently large display interface, and an extended portion of the flexible screen has no back support or weak back support, resulting in a depression feeling for a user when performing a touch operation, thereby impacting the user's hand feeling.

Therefore, there is a need to provide a new flexible display device to solve the above technical problems.

The present invention provides a flexible display device, in order to solve the technical problem of depression feeling for a user when performing a touch operation on the existing flexible display device, caused by no back support or weak back support of a flexible screen when it is unfolded.

SUMMARY OF THE INVENTION

In order to solve the above problem, the technical solution provided by the present invention is as follows:

An embodiment of the present invention provides a flexible display device, including: a case provided with a storage chamber inside the case;

a rewinding component disposed in the storage chamber;

a flexible display component, wherein a portion of the flexible display component is disposed at one side of the case, another portion of the flexible display component extends into the storage chamber and is connected to the rewinding component, and when the flexible display component is pulled out from the storage chamber, the rewinding component provides an elastic pulling force for rolling up the flexible display component;

a rotating component connected to an end of the flexible display component extending from the storage chamber; and a cover plate rotatably connected to the end of the flexible display component extending from the storage chamber through the rotating component.

In the flexible display device according to an embodiment of the present invention, the case includes a main body portion and a sliding portion slidably connected to the main body portion;

when the flexible display component is pulled to extend, the rotating component drives the sliding portion to slide away from the main body portion; and when the flexible display component is rolled up, the rotating component drives the sliding portion to slide in a direction close to the main body portion.

In the flexible display device according to an embodiment of the present invention, each of the rotating component and the sliding portion is provided with a magnetic device, and the rotating component is adsorbed to the sliding portion through the magnetic device.

In the flexible display device according to an embodiment of the present invention, the magnetic device is a magnet.

In the flexible display device according to an embodiment of the present invention, a limiting member is provided on the main body portion and the sliding portion, and configured to limit a sliding range of the sliding portion relative to the main body portion.

In the flexible display device according to an embodiment of the present invention, the sliding portion and the main body portion are both comb-shape structures, and the sliding portion and the main body portion are staggered with each other to fill gaps therebetween.

In the flexible display device according to an embodiment of the present invention, the flexible display component includes a first display portion, a second display portion adjacent to the first display portion, and a third display portion adjacent to the second display portion, and an end of the first display portion away from the second display portion is connected to the rotating component; and wherein an opening is provided on the main body portion, and an end of the third display portion away from the second display portion is connected to the rewinding component through the opening.

In the flexible display device according to an embodiment of the present invention, when the flexible display device is in a first state, the sliding portion overlaps the main body portion, the first display portion is located on the main body portion, the second display portion and the third display portion both extend into the storage chamber, and the cover plate is flipped onto the first display portion around the rotating component, and covers the first display portion.

In the flexible display device according to an embodiment of the present invention, when the flexible display device is in a second state, the sliding portion overlaps the main body portion, the first display portion is located on the main body portion, the second display portion and the third display portion both extend into the storage chamber, and the cover plate is flipped around the rotating component, so that an included angle formed between a plane where the cover plate is located and a plane where the first display portion is located is an inferior angle.

In the flexible display device according to an embodiment of the present invention, when the flexible display device is in a third state, the sliding portion overlaps the main body portion, and the rotating component drives the flexible display component to move in a direction away from the main body portion, so that the second display portion is pulled from the storage chamber and extended to the main body portion, the third display portion is located in the storage chamber, and the cover plate is flipped to a back of the first display portion around the rotating component.

In the flexible display device according to an embodiment of the present invention, when the flexible display device is in a fourth state, the rotating component drives the flexible display component to move away from the main body portion, and the sliding portion slides to a side of the main body portion close to the rotating component, the second display portion is pulled from the storage chamber and extended to the sliding portion, the third display portion is located in the storage chamber, and the cover plate is flipped around the rotating component, so that an included angle formed between a plane where the cover plate is located and a plane where the first display portion is located is an inferior angle.

In the flexible display device according to an embodiment of the present invention, when the flexible display device is in a fifth state, the rotating component drives the flexible display component to move away from the main body portion, and the sliding portion slides to a side of the main body portion close to the rotating component, the second display portion is pulled from the storage chamber and extended to the sliding portion, the third display portion is pulled from the storage chamber and extended onto the main body portion, and the cover plate is flipped on a back of the first display portion around the rotating component.

In the flexible display device according to an embodiment of the present invention, the cover plate and the first display portion of the flexible display component have same shape and size.

In the flexible display device according to an embodiment of the present invention, the flexible display component includes a flexible screen, a protective layer disposed on the flexible screen, and an adhesive layer disposed between the flexible screen and the protective layer, and the rotating component is clamped and connected with an end of the protective layer.

In the flexible display device according to an embodiment of the present invention, the rewinding component includes a rewinding component and at least one pulley having axes parallel to each other, the rewinding component and the pulley are fixed on the case, and an end of the flexible display component away from the rotating component extends into the storage chamber through the opening, and is connected to the rewinding component bypassing the pulley.

In the flexible display device according to an embodiment of the present invention, the rewinding component includes a coil spring.

In the flexible display device according to an embodiment of the present invention, the rotating component includes a first rotating shaft and a second rotating shaft, the first rotating shaft is provided with a hollow chamber adapted to the second rotating shaft, and the second rotating shaft is located in the hollow chamber and extends to opposite ends of the first rotating shaft respectively; and wherein the first rotating shaft is provided with a first groove and a second groove thereon, the end of the flexible display component extending from the storage chamber is connected to the first rotating shaft through the first groove, and the cover plate is connected to the second rotating shaft through the second groove.

In the flexible display device according to an embodiment of the present invention, a functional device is disposed on the cover plate.

In the flexible display device according to an embodiment of the present invention, the functional device is a keyboard.

In the flexible display device according to an embodiment of the present invention, the cover plate is made of a material including a rigid glass.

Beneficial effect of the present invention is that the flexible display device provided by the present invention includes a case, a rewinding component, a flexible display component, a rotating component, and a cover plate. The rotating component drives the flexible display component to pull out of the storage chamber and extend. The rewinding component provides an elastic pulling force for rolling up the flexible display component, which can realize a larger display area and a smaller display area. The flexible display device with a larger display area can be used as a map, and the flexible display device with a smaller display area is convenient for storage and carrying, and applicable to various scenarios. A cover plate is provided at the end of the flexible display component extending from the storage chamber. The cover plate can achieve a 360° flip along the rotating component. When the flexible display component is folded, the cover plate can be used as protective shell or bracket. When the flexible display component is unfolded, the cover plate can be flipped to a back of an extended portion of the flexible display component to function as a support plate or support reinforcement plate, to avoid the depression of the flexible display component, which improves the user's hand feeling.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

The following description of the various embodiments is provided to illustrate the specific embodiments of the present invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

The present invention is directed to solve the technical problem of depression feeling for a user when performing a touch operation on the existing flexible display device, caused by no back support or weak back support of a flexible screen when it is unfolded.

Figure 1:
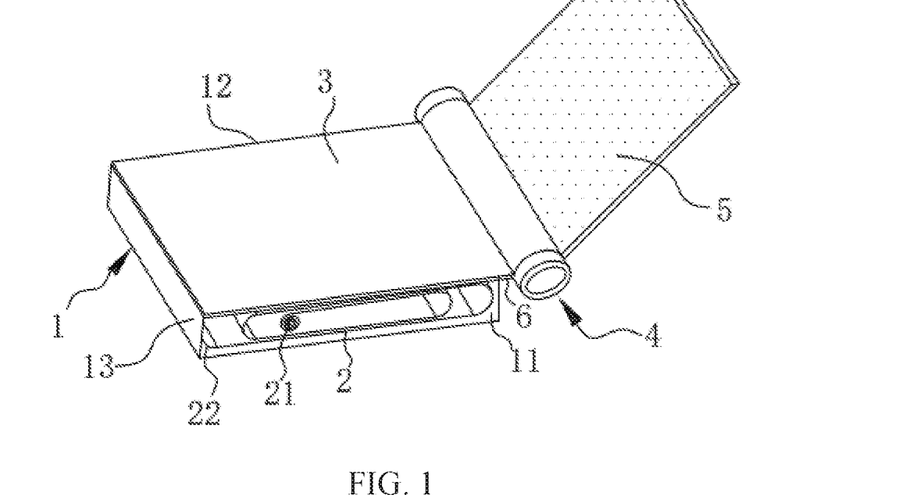
FIG. 1 is a schematic structural diagram of a first flexible display device according to an embodiment of the present invention.

As shown in FIG. 1, an embodiment of the present invention provides a first flexible display device. which includes a case 1, a rewinding component 2, a flexible display component 3, a rotating component 4, and a cover plate 5, wherein the case is provided with a storage chamber 11 inside the case 1, the rewinding component 2 is located in the storage chamber 11, a portion of the flexible display component 3 is disposed at one side of the case 1, another portion of the flexible display component 3 extends into the storage chamber 11 and is connected to the rewinding component 2. Because the rewinding component 2 has an automatic rewinding function, the portion of the flexible display component 3 extending into the storage chamber 11 can be rolled up onto the rewinding component 2. Meanwhile, the portion of the flexible display component 3 wound on the rewinding component 2 can be pulled out from the storage chamber 11 under an effect of external force, and when the flexible display component 3 is pulled out from the storage chamber 11, the rewinding component 2 provides an elastic pulling force for rolling up the flexible display component 3. The rotating component 4 is connected to an end of the flexible display component 3 extending from the storage chamber 11, to apply an external force (such as a pulling force) to the rotating component 4, so as to drive movement of the flexible display component 3. The cover plate 5 is connected to the end of the flexible display component 3 extending from the storage chamber 11 through the rotating component 4, so that the cover plate 5 can be flipped around the rotating component 4.

Specifically, the case 1 includes a main body portion 12 and a sliding portion 13 slidably connected to the main body portion 12, allowing relative sliding between the sliding portion 13 and the main body portion 12 to increase an upper surface area of the case 1. In an embodiment of the present invention, the sliding portion 13 is located on the upper surface of the main body portion 12, and the sliding portion 13 is a rectangular plate-like structure. Optionally, a sliding track may be provided on the main body portion 12, and the sliding portion 13 slides along the sliding track.

The main body portion 12 is provided with an opening, and the opening is disposed away from the rotating component 4. The opening may be located at an upper portion of the main body portion 12 or a side portion of the main body portion 12, which is not limited herein. Using the rotating component 4 as a handle, when the flexible display component 3 is pulled and extended, the rotating component 4 drives the sliding portion 13 to slide away from the main body portion 12 so that the flexible display component 3 is pulled out of the storage chamber 11; when the flexible display component 3 is rolled up and folded, the rotating component 4 drives the sliding portion 13 to slide toward the main body portion 12 so that the flexible display component 3 extends into the storage chamber 11 and is rolled up and wound onto the rewinding component 2.

Specifically, the flexible display component 3 includes a first display portion 31, a second display portion 32 adjacent to the first display portion 31, and a third display portion 33 adjacent to the second display portion 32, wherein, an end of the first display portion 31 away from the second display portion 32 is connected to the rotating component 4, and an end of the third display portion 33 away from the second display portion 32 is connected to the rewinding component 2 through the opening. It should be noted that the flexible display unit 3 is not formed by splicing the first display portion 31, the second display portion 32, and the third display portion 33, but is formed in one piece. In order to clearly explain the technical solution of the present application, the embodiment of the present invention merely divides the flexible display component 3 into the first display portion 31, the second display portion 32, and the third display portion 33 as an example.

Figure 2A:
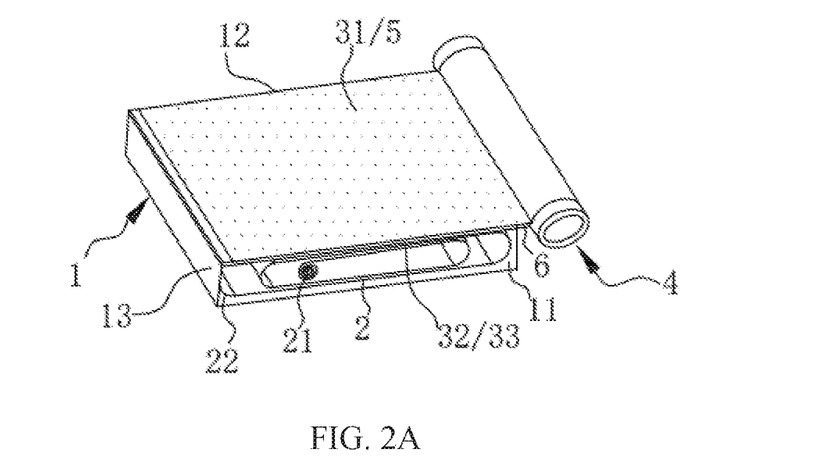
FIG. 2A is a schematic structural diagram of a first flexible display device in a first state according to an embodiment of the present invention.

As shown in FIG. 2A, when the flexible display device is in the first state, no relative sliding occurs between the sliding portion 13 and the main body portion 12, and the sliding portion 13 overlaps the main body portion 12. The first display portion 31 is located on an upper surface of the main body portion 12, and the second display portion 32 and the third display portion 33 both extend into the storage chamber 11 through the opening and are wound onto the rewinding component 2. The first display portion 31 may be in a display or non-display state, and the second display portion 32 and the third display portion 33 are both in a non-display state. The cover plate 5 is flipped onto the first display portion 31 around the rotating component and covers the first display portion 31. In this case, the cover plate 5 can be used as a protective shell of the flexible display device to prevent the first display portion 31 exposed to the outside from being subject to impacts, drops, scratches, and the like, especially in a more severe military environment, which can reduce the risk of damage to the flexible display device and extend the service life of the product.

In this state, when the flexible display device is not in use, the first display portion 31 is in a non-display state, and because the flexible display device is small in size, it is convenient for storage and carrying; and when the flexible display device is not in use, the first display portion 31 is in a display state, the cover plate 5 is made of a transparent glass material, and a user can view or operate the first display portion 31 through the cover plate 5.

Figure 2B:
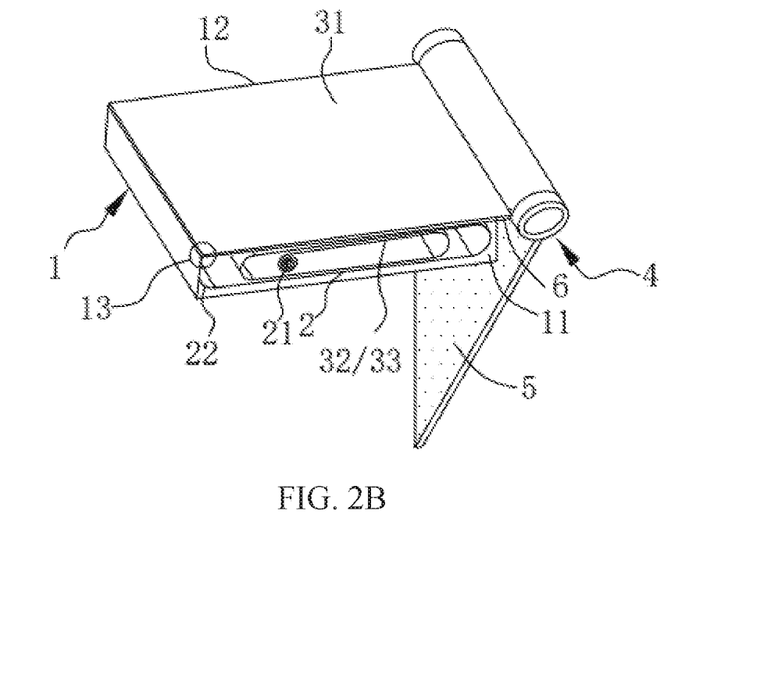
FIG. 2B is a schematic structural diagram of a first flexible display device in a second state according to an embodiment of the present invention.

As shown in FIG. 2B, when the flexible display device is in a second state, no relative sliding occurs between the sliding portion 13 and the main body portion 12, and the sliding portion 13 overlaps the main body portion 12. The first display portion 31 is located on the upper surface of the main body portion 12, and the second display portion 32 and the third display portion 33 both extend into the storage chamber 11 through the opening and are wound onto the rewinding component 2. The second display portion 32 and the third display portion 33 are both in a non-display state.

The second state is different from the first state in that the first display portion 31 is in a display state, and the cover plate 5 is flipped around the rotating component 4, so that an included angle formed between a plane where the cover plate 5 is located and a plane where the first display portion 31 is located is an inferior angle (0°≤θ<180°), and preferably, 0°<θ<90°.

In this state, the cover plate 5 can be used as a bracket for an electronic device to which the flexible display device is applied, so that a user does not need to hold the electronic device during use, avoiding unfavorable factors such as pain of wrists and arms and movement inconvenience of both hands when holding the electronic device for a long time. Especially in military activities, users often need to perform multiple operations simultaneously by both hands, which is convenient and practical and has strong operability; and meanwhile, the cover plate 5 can be used as a grasping plane, which is more convenient.

Figure 2C:
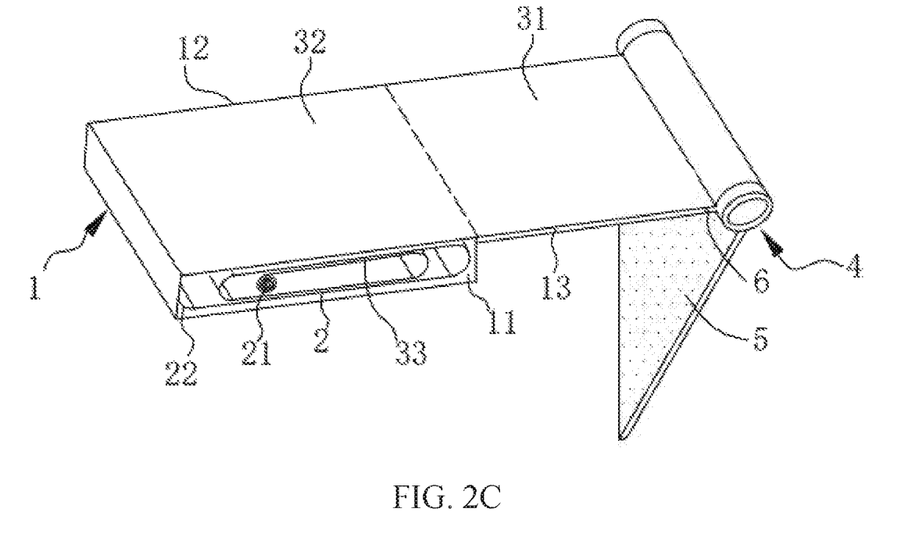
FIG. 2C is a schematic structural diagram of a first flexible display device in a third state according to an embodiment of the present invention.

As shown in FIG. 2C, when the flexible display device is in a third state, the third state is different from the first state and the second state in that the second display portion 32 is also pulled out of the storage chamber 11.

Specifically, no relative sliding occurs between the sliding portion 13 and the main body portion 12, and the sliding portion 13 overlaps the main body portion 12. the rotating component drives the sliding portion to slide away from the main body portion. The rotating component 4 drives the flexible display component 3 to move away from the main body portion 12, so that the second display portion 32 is pulled from the storage chamber 11 and extended to the main body portion 12 through the opening. The first display portion 31 is in a suspended state, the second display portion 32 is supported by the main body portion 12, and the third display portion 33 is located in the storage chamber 11. In this case, the first display portion 31 and the second display portion 32 are both in the display state, the third display portion 33 is in the non-display state, and the cover plate 5 is flipped around the rotating component 4 to the back of the first display portion 31 to support the first display portion 31.

In this state, the cover plate 5 can serve as a back support plate of the first display portion 31, thereby avoiding a user from having a depression feeling when performing a touch operation, thus improving the user's hand feeling.

Figure 2D:
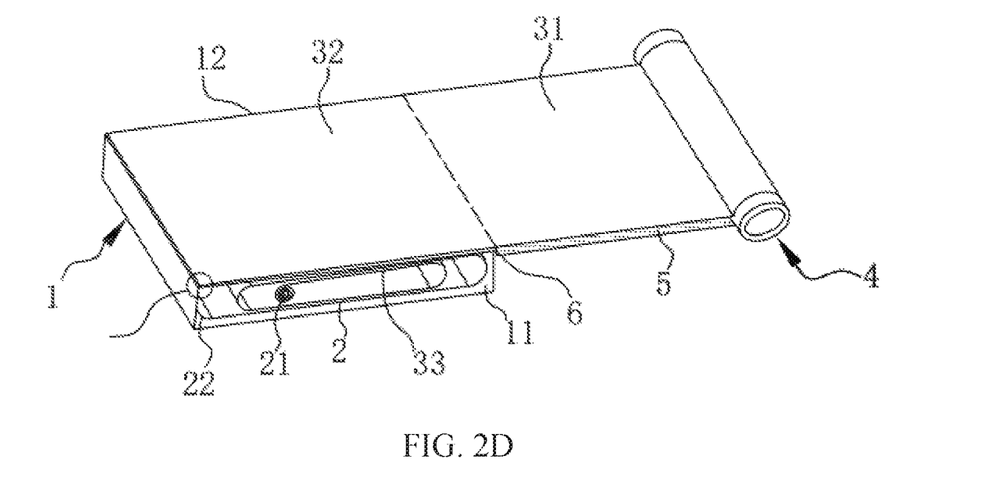
FIG. 2D is a schematic structural diagram of a first flexible display device in a fourth state according to an embodiment of the present invention.

As shown in FIG. 2D, when the flexible display device is in a fourth state, the fourth state is different from the third state in that a relative sliding occurs between the sliding portion 13 and the main body portion 12.

Specifically, the rotating component 4 drives the flexible display component 3 to move away from the main body portion 12, and the sliding portion 13 slides to a side of the main body portion 12 close to the rotating component 4. The second display portion 32 is pulled from the storage chamber 11 and extended onto the sliding portion 13, the first display portion 31 moves onto the sliding portion 13, and the second display portion 32 moves onto the main body portion 12; the first display portion 31 is supported by the sliding portion 13, the second display portion 32 is supported by the main body portion 12, and the third display portion 33 is located in the storage chamber 11. In this case, when the first display portion 31 and the second display portion 32 are both in a display state, and the third display portion 33 is in a non-display state, the cover plate 5 is flipped around the rotation component 4, such that an included angle formed between the plane where the cover plate 5 is located and the plane where the first display portion 31 is located is an inferior angle (0°≤θ<180°), preferably, 0°<θ<90°.

In this state, similar to the second state, the cover plate 5 can be used as a bracket for electronic equipment to which the flexible display device is applied, or the cover plate 5 can be flipped to the back of the sliding portion 13 (θ is 0°), used as a support reinforcement plate of the first display portion 31 to increase support stability. Meanwhile, the flexible display device has a larger display area than the second state, and can be applied to more use scenarios.

Figure 2E:
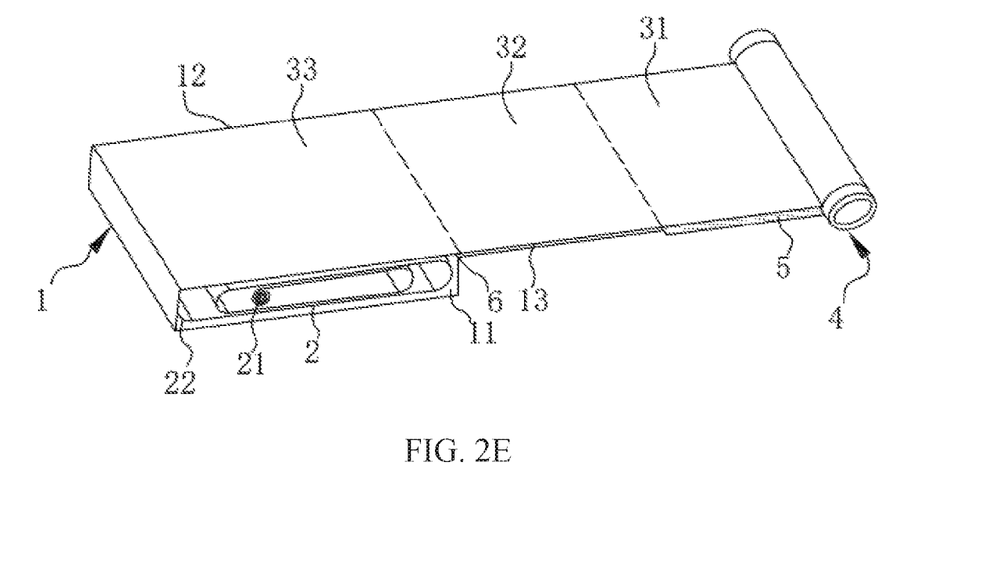
FIG. 2E is a schematic structural diagram of a first flexible display device in a fifth state according to an embodiment of the present invention.

As shown in FIG. 2E, when the flexible display device is in a fifth state, the fifth state is different from the fourth state in that the third display portion 33 is also pulled out of the storage chamber 11.

Specifically, relative sliding occurs between the sliding portion 13 and the main body portion 12. The sliding portion 13 slides to a side of the main body portion 12 close to the rotating component 4, the second display portion 32 is pulled from the storage chamber 11 and extended to the sliding portion 13, and the third display portion 33 is pulled from the storage chamber 11 and extended to the main body portion 12. The first display portion 31 is located in a suspended state, the second display portion 32 is supported by the sliding portion 13, and the third display portion 33 is supported by the main body portion 12. In this case, the first display portion 31, the second display portion 32, and the third display portion 33 are all in a display state, and the cover plate 5 is flipped around the rotating component 4 to the back of the first display portion 31.

In this state, similar to the third state, the cover plate 5 can be used as a back support plate of the first display portion 31, thereby preventing the user from having a depression feeling when performing a touch operation, which improves the user's hand feeling. Meanwhile, the flexible display device has a larger display area than the second state, the third state, and the fourth state, and can be applied to more use scenarios.

In an embodiment of the present invention, the cover plate 5 and the first display portion 31 of the flexible display component 3 have the same shape and size, so that the cover plate 5 can completely cover or fully support the first display portion 31. The upper surface of the sliding portion 13 and the main body portion 12 have the same shape and size, that is, the first display portion 31, the second display portion 32, and the third display portion 33 have the same display area.

It can be understood that if an area of the first display portion 31 is used as a unit display area, the display areas of the first display portion 31, the second display portion 32, and the third display portion 33 are all equivalent to the unit display area. When the flexible display device is in the first state and the second state, the flexible display device has 1 unit display area; when the flexible display device is in the third state and the fourth state, the flexible display device has 2 times the unit display area; when the flexible display device is in the fifth state, and the flexible display device has 3 times the unit display area. Of course, it should be noted that in other embodiments, the display areas of the first display portion 31, the second display portion 32, and the third display portion 33 may not be equal, and a size relationship of the display areas of the flexible display device in different states will also be changed accordingly. Therefore, a user can select the corresponding display state according to the actual needs and application scenarios to obtain a larger display area or a smaller display area. When the flexible display device has a larger display area, it can be used as an electronic military map, etc., to provide a more clear landscape and layout, and military site parameters can be set through Bluetooth or a network connection, having a great military value, while when the flexible display device has a smaller display area, it can be used as a mobile phone, military controllers, etc., and are convenient to store and carry, suitable for various scenarios.

Preferably, a magnetic device 6 is provided on each of the rotating component 4 and the sliding portion 13, and the rotating component 4 is adsorbed to the sliding portion 13 through the magnetic device 6.

Specifically, when the flexible display device is in the first state and the second state, the rotating component 4 is maintained in a tightly fixed connection with the sliding portion 13. When the flexible display device is in the third state, an external pulling force applied to the rotating component 4 is greater than a magnetic force between the sliding portion 13 and the rotating component 4, so the rotating component 4 and the case 1 are separated from each other, so that the rotating component 4 drives the flexible display component 3 to move away from the main body portion 12. When the cover plate 5 is flipped to the back of the first display portion 31, a side of the cover plate 5 away from the rotating component 4 abuts against a side of the rotating component 4 close to the sliding portion 13.

When the flexible display device is in a fourth state or a fifth state, first, an external pulling force applied to the rotating component 4 is smaller than a magnetic force between the sliding portion 13 and the rotating component 4, and the rotating component 4 and the sliding portion 13 are separated from each other, so that the rotating component 4 drives the flexible display component 3 and the sliding portion 13 at the same time to move away from the main body portion 12. Further, a limiting member is provided on the main body portion 12 and the sliding portion 13. The limiting member is used to limit the sliding range of the sliding portion 13 relative to the main body portion 12. Therefore, the sliding portion 13 is restricted after moving a certain distance. In this case, an external pulling force applied to the rotating component 4 is greater than a magnetic force between the sliding portion 13 and the rotating component 4, the sliding portion 13 stops moving, and the rotating component 4 drives the flexible display component 3 to continuously move away from the main body portion 12, so that the second display portion 32 and/or the third display portion 33 are pulled out of the storage chamber 11. Similarly, when the cover plate 5 is flipped to the back of the first display portion 31, a side of the cover plate 5 away from the rotating component 4 abuts against a side of the sliding portion 13 close to the rotating component 4.

Optionally, the magnetic device 6 may be a magnet.

Figure 3:
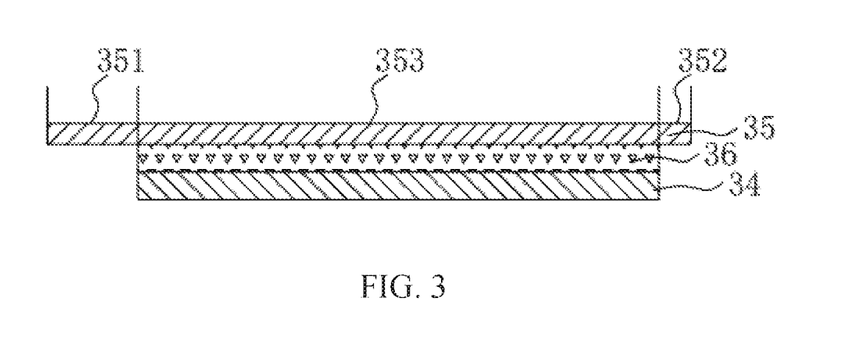
FIG. 3 is a schematic cross-sectional structural diagram of a flexible display component according to an embodiment of the present invention.

Specifically, as shown in FIG. 3, the flexible display component 3 includes a flexible screen 34, a protective layer 35 disposed on the flexible screen 34, and an adhesive layer 36 disposed between the flexible screen 34 and the protective layer 35, wherein the rotating component 4 is clamped and connected to one end of the protective layer 35.

The protective layer 35 includes a first segment 351, a second segment 352, and a third segment 353 located between the first segment 351 and the second segment 352. The first segment 351 is located at an end of the first display portion 31 away from the second display portion 32. The third portion 353 is disposed corresponding to the flexible screen 34. On the one hand, the first portion 351 is configured to connect rotating component 4. The rotating component 4 drives the flexible display component 3 to move. In fact, the rotating component 4 directly drives the protective layer 35 to move, so that the protective layer 35 thereby drives the flexible screen 34 to move, which can prevent the flexible component 34 from being directly pulled by the rotating component 4, resulting in damage to the flexible screen 34 due to excessive stress. On the other hand, since the second segment 352 is not correspondingly provided with the flexible screen 34, it can ensure that the protective layer 35 is the one rolled onto the rewinding component 2, thereby ensuring that the flexible screen 34 receives less stress.

Optionally, the material of the protective layer 35 may be a flexible polyimide film or other transparent organic film, and the flexible screen 34 may be an organic light-emitting diode (OLED) display screen. The adhesive layer 36 may be an adhesive layer such as an optical adhesive.

Specifically, the rewinding component 2 includes a rewinding component 21 and at least one pulley 22 having axes parallel to each other, the rewinding component 21 and the pulley 22 are fixed on the case, and one end of the flexible display component 3 away from the rotating component 4 extends from the opening into the storage chamber 11, and is connected to the rewinding component 21 around the pulley 22.

Optionally, the rewinding component 21 is a coil spring. Since the coil spring can continuously provide a large restoring force in a small space, when the flexible display component 3 is pulled out of the storage chamber 11, The coil spring can provide an elastic pulling force for rolling up the flexible display component 3 and can automatically pull the flexible display component 3 into the storage chamber 11. For example, if the rotating component 4 drives the flexible display component 3 to move away from the main body portion 12 by a distance that is too long and exceeds a preset distance that can be matched with the cover plate 5, the coil spring can automatically pull back and roll up the excess portion the flexible display component 3, and provide a certain pulling force for the flexible display component 3 to have a flat unfolded surface.

Figure 4:
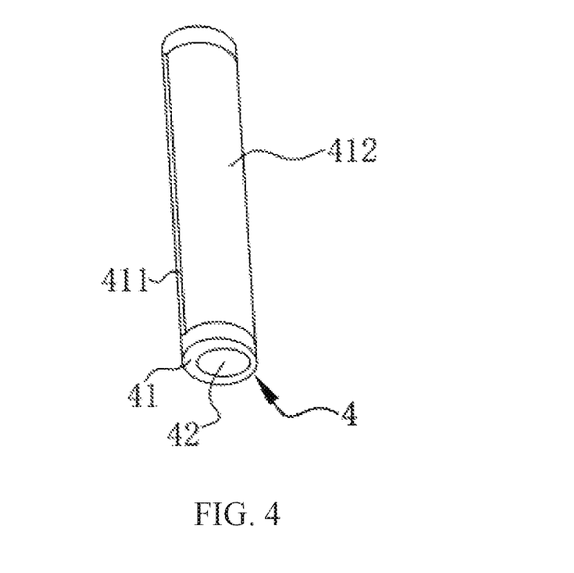
FIG. 4 is a schematic structural diagram of a rotating component according to an embodiment of the present invention.

Specifically, as shown in FIG. 4, the rotating component 4 includes a first rotating shaft 41 and a second rotating shaft 42, wherein the first rotating shaft 41 is provided with a hollow chamber adapted to the second rotating shaft 42, and the second rotating shaft 42 is located in the hollow chamber and extends to opposite ends of the first rotating shaft, respectively. The first rotating shaft 41 is provided with a first groove 411 and a second groove 412 thereon, the end of the flexible display component 3 extending from the storage chamber 11 is connected to the first rotating shaft 41 through the first groove 411, and the cover plate 5 is connected to the second rotating shaft 42 through the second groove 412. A shape and a volume of the hollow chamber are the same as a shape and a size of the second rotating shaft 42, and a depth of the first groove 411 is smaller than a depth of the second groove 412, so that at least a portion of the surface of the second rotating shaft 42 is exposed to the outside through the second groove 412. Of course, the rotating component 4 can also have other structures, as long as the rotating component 4 can be connected to the flexible display component 3 and the cover plate 5 respectively, and the cover plate 5 can be flipped at any angle (in an range from 0° to 360°) around the rotating component 4.

Specifically, the cover plate 5 may be made of rigid glass, or of course, other hard materials, and the embodiment of the present invention should not be limited thereto.

The cover plate 5 can also be provided with a functional device, such as a keyboard, which is highly operable and meets diverse needs of users.

Figure 5:
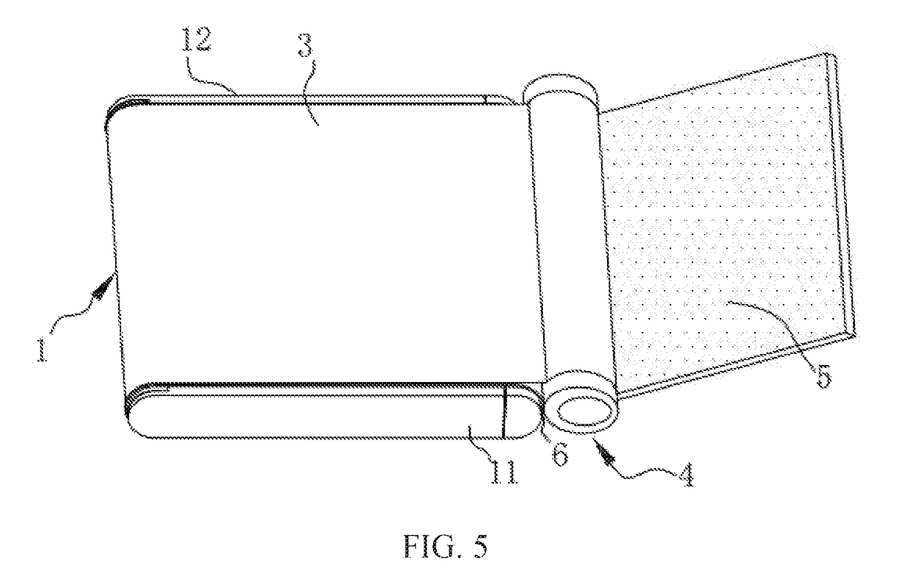
FIG. 5 is a schematic structural diagram of a second flexible display device according to an embodiment of the present invention.
Figure 6:
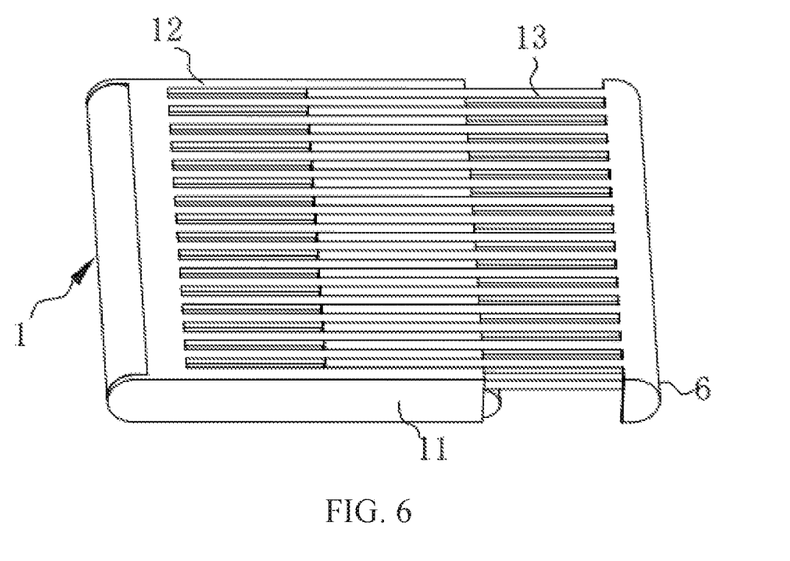
FIG. 6 is a schematic structural diagram of a case of a second flexible display device according to an embodiment of the present invention.
Figure 7A:
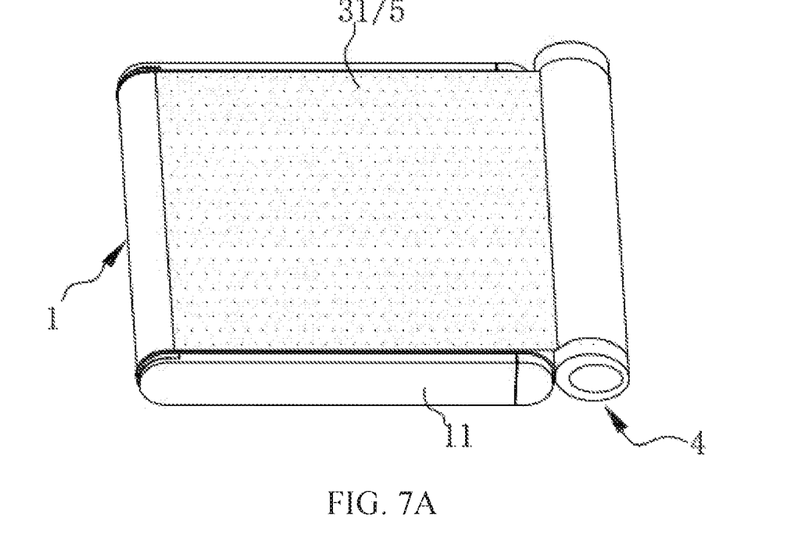
FIG. 7A is a schematic structural diagram of a second flexible display device in a first state according to an embodiment of the present invention.
Figure 7B:
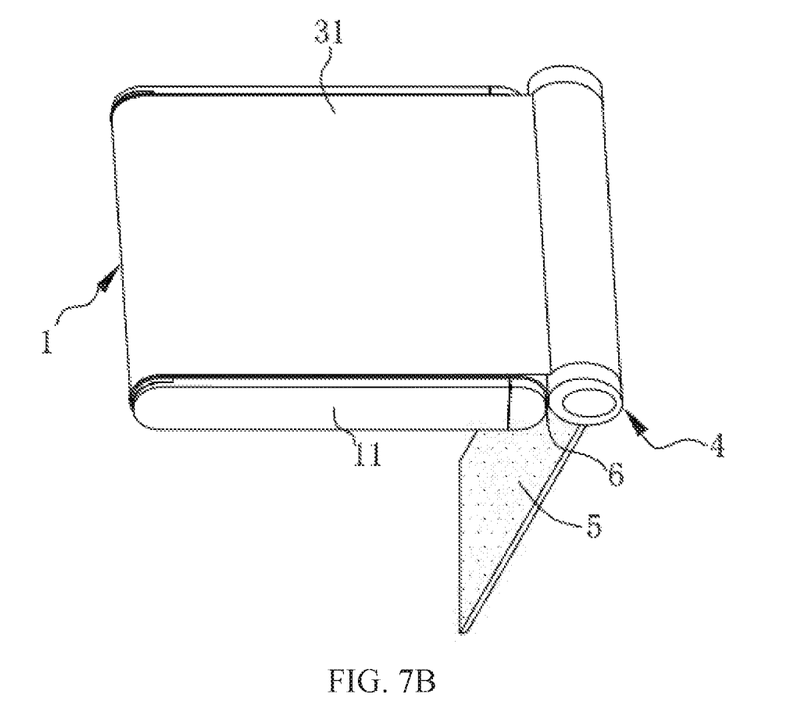
FIG. 7B is a schematic structural diagram of a second flexible display device in a second state according to an embodiment of the present invention.
Figure 7C:
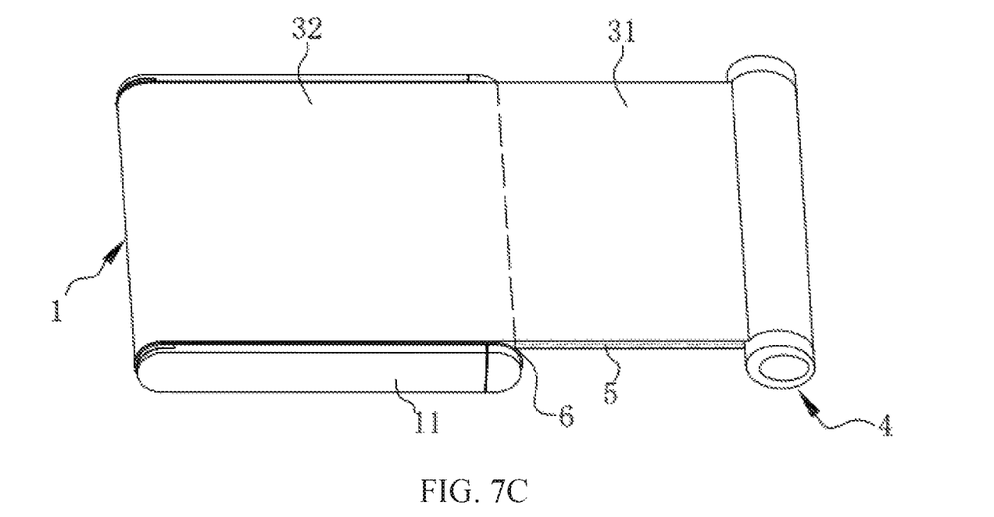
FIG. 7C is a schematic structural diagram of a second flexible display device in a third state according to an embodiment of the present invention.
Figure 7D:
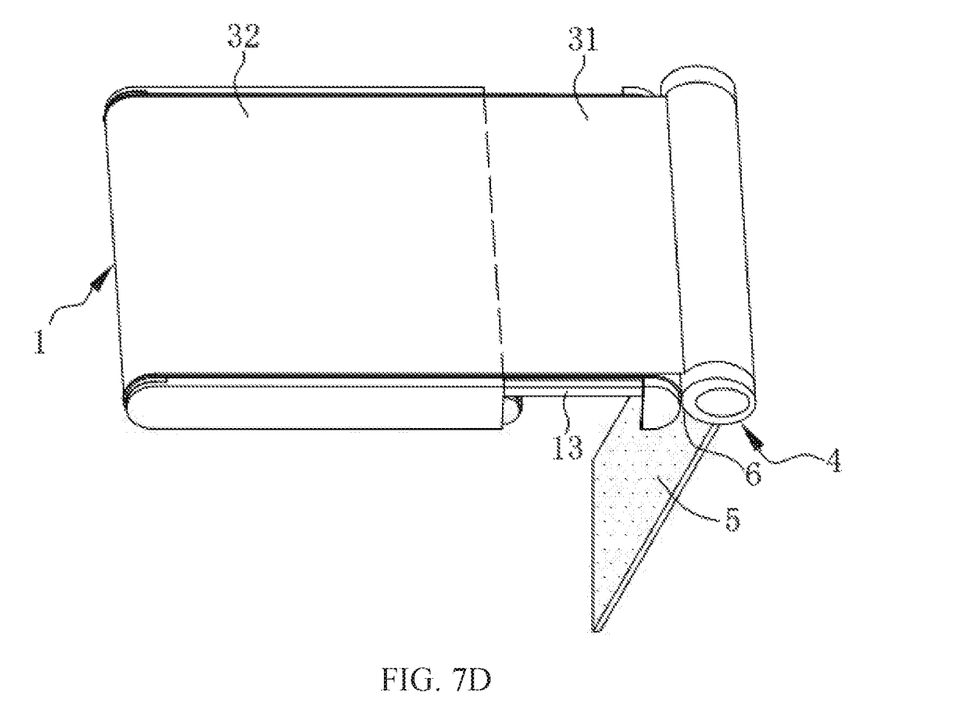
FIG. 7D is a schematic structural diagram of a second flexible display device in a fourth state according to an embodiment of the present invention.
Figure 7E:
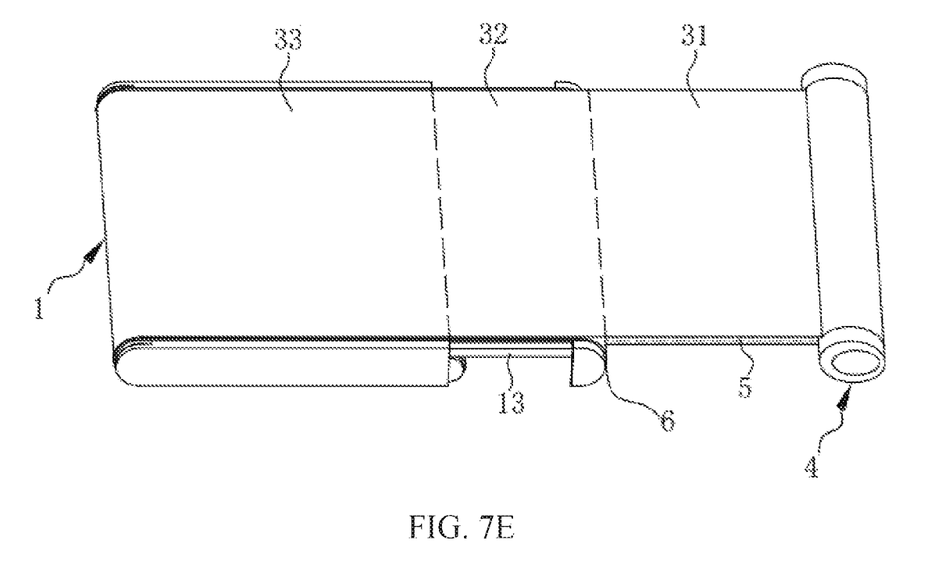
FIG. 7E is a schematic structural diagram of a second flexible display device in a fifth state according to an embodiment of the present invention.

As shown in FIG. 5, a structure of the second flexible display device provided by an embodiment of the present invention is similar to that of the first flexible display device in FIG. 1, and includes a case 1, a rewinding component (not shown), a flexible display component 3, a rotating component 4, and the cover plate 5. FIG. 6 is a structural schematic diagram of the case 1 of the second flexible display device, different from the first flexible display device in that the sliding portion 13 and the main body portion 12 both have comb-shaped structures, and the sliding portion 13 and the main body portion 12 are staggered with each other to fill gaps therebetween, so that the sliding portion 13 and the main body portion 12 can slide relative to each other.

FIG. 7A, FIG. 7B, FIG. 7C, FIG. 7D and FIG. 7E are schematic structural diagrams of the flexible display device in FIG. 4 in the first state, the second state, the third state, the fourth state, and the fifth state, respectively. Implementation processes, principles, and beneficial effects of the above several states are the same as the first flexible display device in the first state, the second state, the third state, the fourth state, and the fifth state, respectively. Details may be referred to the foregoing descriptions of FIG. 2A, FIG. 2B, FIG. 2C, FIG. 2D, and FIG. 2E, and are not repeated herein for brevity.

Similarly, the sliding portion 13 and the main body portion 12 may be other structures that can slide relative to each other, which are all within the protection scope of the present application.

It should be noted that, in order to clearly explain the technical solution of the present application, the embodiments of the present invention only use the display area of the flexible display device when it is unfolded to be 2 times and 3 times the display area of the flexible display device when it is not expanded as examples, but this application is not particularly limited thereto, and the display area of the flexible display device when it is unfolded may be 4 times, 5 times, or even more times the display area of the flexible display device when it is folded, which are all within the protection scope of the present application.

Beneficial effect of the present invention is that the flexible display device provided by the present invention includes a case, a rewinding component, a flexible display component, a rotating component, and a cover plate. The rotating component drives the flexible display component to pull out of the storage chamber and extend. The rewinding component provides an elastic pulling force for rolling up the flexible display component, which can realize a larger display area and a smaller display area. The flexible display device with a larger display area can be used as a map, and the flexible display device with a smaller display area is convenient for storage and carrying, and applicable to various scenarios. A cover plate is provided at the end of the flexible display component extending from the storage chamber. The cover plate can achieve a 360° flip along the rotating component. When the flexible display component is folded, the cover plate can be used as protective shell or bracket. When the flexible display component is unfolded, the cover plate can be flipped to a back of an extended portion of the flexible display component to function as a support plate or support reinforcement plate, to avoid the depression of the flexible display component, which improves the user's hand feeling.

While the present invention has been described by way of example and in terms of the preferred embodiments, it is to be understood that the present invention is not limited to the disclosed embodiments. To the contrary, it is intended to cover plate various modifications and similar arrangements. Therefore, the scope of the appended claims should be accorded the broadest interpretation so as to encompass all such modifications and similar arrangements.

What is claimed is:

1. A flexible display device, comprising: a case provided with a storage chamber inside the case; a rewinding component disposed in the storage chamber; a flexible display component, wherein a portion of the flexible display component is disposed at one side of the case, another portion of the flexible display component extends into the storage chamber and is connected to the rewinding component, and when the flexible display component is pulled out from the storage chamber, the rewinding component provides an elastic pulling force for rolling up the flexible display component; a rotating component connected to an end of the flexible display component extending from the storage chamber; and the rotating component comprises a first rotating shaft and a second rotating shaft, the first rotating shaft is provided with a hollow chamber adapted to the second rotating shaft, the second rotating shaft is located in the hollow chamber and extends to opposite ends of the first rotating shaft respectively; and wherein the first rotating shaft is provided with a first groove and a second groove thereon, the end of the flexible display component extending from the storage chamber is connected to the first rotating shaft through the first groove, and the cover plate is connected to the second rotating shaft through the second groove; and a cover plate rotatably connected to the end of the flexible display component extending from the storage chamber through the rotating component; and the case comprises a main body portion and a sliding portion slidably connected to the main body portion and absorbed to the rotating component through a magnetic force; when the flexible display component is pulled to extend, the rotating component drives the sliding portion to slide away from the main body portion; and when the flexible display component is rolled up, the rotating component drives the sliding portion to slide in a direction close to the main body portion; and the sliding portion and the main body portion are both comb-shape structures, and the sliding portion and the main portion are staggered with each other to fill gaps therebetween; when the flexible display device is in a first state, the sliding portion overlaps the main body portion, the first display portion is located on the main body portion, the second display portion and the third display portion both extend into the storage chamber, and the cover plate is flipped onto the first display portion around the rotating component, and covers the first display portion.

2. The flexible display device according to claim 1, wherein each of the rotating component and the sliding portion is provided with a magnetic device, and the rotating component is adsorbed to the sliding portion through the magnetic device.

3. The flexible display device according to claim 1, wherein the magnetic device is a magnet.

4. The flexible display device according to claim 1, further comprising a limiting component disposed on the main body portion and the sliding portion, and the limiting component is configured to limit a sliding range of the sliding portion relative to the main body portion.

5. The flexible display device according to claim 1, wherein the flexible display component comprises a first display portion, a second display portion adjacent to the first display portion, and a third display portion adjacent to the second display portion, and an end of the first display section away from the second display section is connected to the rotating component; and wherein an opening is provided on the main body portion, and an end of the third display portion away from the second display portion is connected to the rewinding component through the opening.

6. The flexible display device according to claim 5, wherein when the flexible display device is in a second state, the sliding portion overlaps the main body portion, the first display portion is located on the main portion, the second display portion and the third display portion both extend into the storage chamber, and the cover plate is flipped around the rotating component, so that an included angle formed between a plane where the cover plate is located and a plane where the first display portion is located is an inferior angle.

7. The flexible display device according to claim 5, wherein when the flexible display device is in a third state, the sliding portion overlaps the main portion, and the rotating component drives the flexible display component to move in a direction away from the main body portion, so that the second display portion is pulled from the storage chamber and extended to the main body portion, the third display portion is located in the storage chamber, and the cover plate is flipped to a back of the first display portion around the rotating component.

8. The flexible display device according to claim 5, wherein when the flexible display device is in a fourth state, the rotating component drives the flexible display component to move away from the main body portion, and the sliding portion slides to a side of the main portion close to the rotating component, the second display portion is pulled from the storage chamber and extended to the sliding portion, the third display portion is located in the storage chamber, and the cover plate is flipped around the rotating component, so that an included angle formed between a plane where the cover plate is located and a plane where the first display portion is located is an inferior angle.

9. The flexible display device according to claim 5, wherein when the flexible display device is in a fifth state, the rotating component drives the flexible display component to move away from the main body portion, and the sliding portion slides to a side of the main body portion close to the rotating component, the second display portion is pulled from the storage chamber and extended to the sliding portion, the third display portion is pulled from the storage chamber and extended onto the main body portion, and the cover plate is flipped on a back of the first display portion around the rotating component.

10. The flexible display device according to claim 5, wherein the cover plate and the first display portion of the flexible display component have same shape and size.

11. The flexible display device according to claim 1, wherein the flexible display component comprises a flexible screen, a protective layer disposed on the flexible screen, and an adhesive layer disposed between the flexible screen and the protective layer, and the rotating component is clamped and connected with an end of the protective layer.

12. The flexible display device according to claim 1, wherein the rewinding component comprises a rewinding component and at least one pulley having axes parallel to each other, the rewinding component and the pulley are fixed on the case, and an end of the flexible display component away from the rotating component extends into the storage chamber through the opening, and is connected to the rewinding component bypassing the pulley.

13. The flexible display device according to claim 12, wherein the rewinding component comprises a coil spring.

14. The flexible display device according to claim 1, wherein a functional device is disposed on the cover plate.

15. The flexible display device according to claim 14, wherein the functional device is a keyboard.

16. The flexible display device according to claim 1, wherein the cover plate is made of a material comprising a rigid glass.

* * * * *